(12) United States Patent
Bugeja et al.

(10) Patent No.: US 6,417,793 B1
(45) Date of Patent: Jul. 9, 2002

(54) TRACK/ATTENUATE CIRCUIT AND METHOD FOR SWITCHED CURRENT SOURCE DAC

(75) Inventors: Alex R. Bugeja, Dallas, TX (US); Bang-Sup Song, La Jolla, CA (US)

(73) Assignee: Rockwell Technologies, LLC, Thousand Oaks, CA (US)

( * ) Notice: Subject to any disclaimer, the term of this patent is extended or adjusted under 35 U.S.C. 154(b) by 0 days.

(21) Appl. No.: 09/578,838

(22) Filed: May 25, 2000

Related U.S. Application Data
(60) Provisional application No. 60/180,434, filed on Feb. 4, 2000.

(51) Int. Cl.[7] .............................................. H03M 1/66
(52) U.S. Cl. ...................................... 341/144; 341/143
(58) Field of Search ................................ 341/144, 156, 341/161, 118, 120; 327/307, 308; 369/124

(56) References Cited

U.S. PATENT DOCUMENTS

| | | | |
|---|---|---|---|
| 5,606,320 A | * 2/1997 | Kleks .......................... 341/161 |
| 5,614,903 A | 3/1997 | Oyama ........................ 341/118 |
| 5,646,620 A | 7/1997 | Regler ......................... 341/118 |
| 5,796,286 A | * 8/1998 | Otaka .......................... 327/308 |
| 6,069,866 A | * 5/2000 | Pietruszynski et al. ..... 369/124 |
| 6,141,169 A | * 10/2000 | Pietruszynski et al. ....... 360/67 |

* cited by examiner

*Primary Examiner*—Peguy Jeanpierre
*Assistant Examiner*—Joseph Lauture
(74) *Attorney, Agent, or Firm*—Koppel, Jacobs, Patrick & Heybl

(57) ABSTRACT

A track and attenuate (T/A) circuit for use with switched current source DACs is connected across the DAC's differential current outputs. The T/A circuit includes three attenuate switches: first and second single-ended switches which connect the positive and negative sides of the differential output, respectively, to signal ground, and a third, differential switch which connects the positive and negative output lines together. The three attenuate switches are closed simultaneously during a portion of each cycle of the DAC's sample clock, to attenuate the DAC's current outputs while the outputs of the switched current sources are settling—thereby preventing dynamic nonlinearities from being introduced into the differential output current. When properly sized, the three attenuate switches (when closed) reduce the differential output current to near zero and lower the common mode voltage between the positive and negative output lines, significantly improving the DAC's dynamic linearity.

23 Claims, 4 Drawing Sheets

TRACK/ATTENUATE CIRCUIT AND METHOD FOR SWITCHED CURRENT SOURCE DAC

This application claims the benefit of provisional patent application No. 60/180,434 to Song et al., filed Feb. 4, 2000.

BACKGROUND OF THE INVENTION

1. Field of the Invention

This invention relates to the field of digital-to-analog converters (DACs), and particularly to circuits and methods for improving the dynamic linearity of switched current source DACs.

2. Description of the Related Art

Demand for high speed/high resolution DACs continues to grow, driven primarily by strong growth in the markets for wired and wireless communications. One architecture which has been used to construct high speed/high resolution DACs employs an array of current sources: the DAC receives a digital input word which represents a desired output current, and the current sources are selectively switched to an output to provide the desired output current. Such DACs have been favored for high speed and high resolution applications due to their ability to drive a resistive load directly, without the need for a voltage buffer.

Unfortunately, these "switched current source" DACs have a serious drawback: when the digital input word changes, some or all of the DAC's internal current sources switch in response, which, due to parasitics and possible skew in the switching action, gives rise to dynamic nonlinearities and transient errors that degrade the DAC's dynamic linearity—commonly quantified with a spurious free dynamic range (SFDR) specification.

Several methods have been employed to improve the dynamic linearity of switched current source DACs. One such method is described in U.S. Pat. No. 5,646,620, in which a bipolar transistor switches the DAC output current to ground while its current sources are in transition. However, this technique is only used with a DAC having a single-ended output. Furthermore, the resistance of the bipolar transistor switch when on is well above zero ohms, limiting the degree to which the output can be attenuated and thereby permitting some of the switching glitches to pass through to the output.

Another approach is discussed in U.S. Pat. No. 5,614,903, which describes a track-and-reset diode bridge switch connected to the output of a DAC. However, this technique provides a means for attenuating the DAC's output voltages, and is thus suited for use with voltage-mode DACs only. The amount of attenuation this approach can provide is also inherently limited, due to the resistances of the diode bridge switch components.

SUMMARY OF THE INVENTION

A track and attenuate (T/A) circuit and method for use with switched current source DACs is presented, which significantly improves the dynamic linearity of such DACs.

The present invention is applicable to switched current source DACs which produce a differential output current. The T/A circuit is connected across the DAC's differential outputs and includes three attenuate switches: first and second single-ended switches which connect the positive and negative sides of the differential output, respectively, to signal ground, and a third differential switch which connects the positive and negative output lines together.

The three attenuate switches are closed during a portion of each cycle of the DAC's sample clock, to attenuate the DAC output while the outputs of the switched current sources are settling—thereby preventing dynamic nonlinearities that result from switching the current sources from being introduced into the differential output current. When properly sized, the three attenuate switches (when closed) reduce the differential output current to near zero and lower the common mode voltage between the output lines. If necessary, a low pass filter may be used to filter the differential output current to reduce the magnitude of clock frequency spurs introduced into the output spectrum by the T/A circuit.

Further features and advantages of the invention will be apparent to those skilled in the art from the following detailed description, taken together with the accompanying drawings.

DETAILED DESCRIPTION OF THE INVENTION

Figure 1:
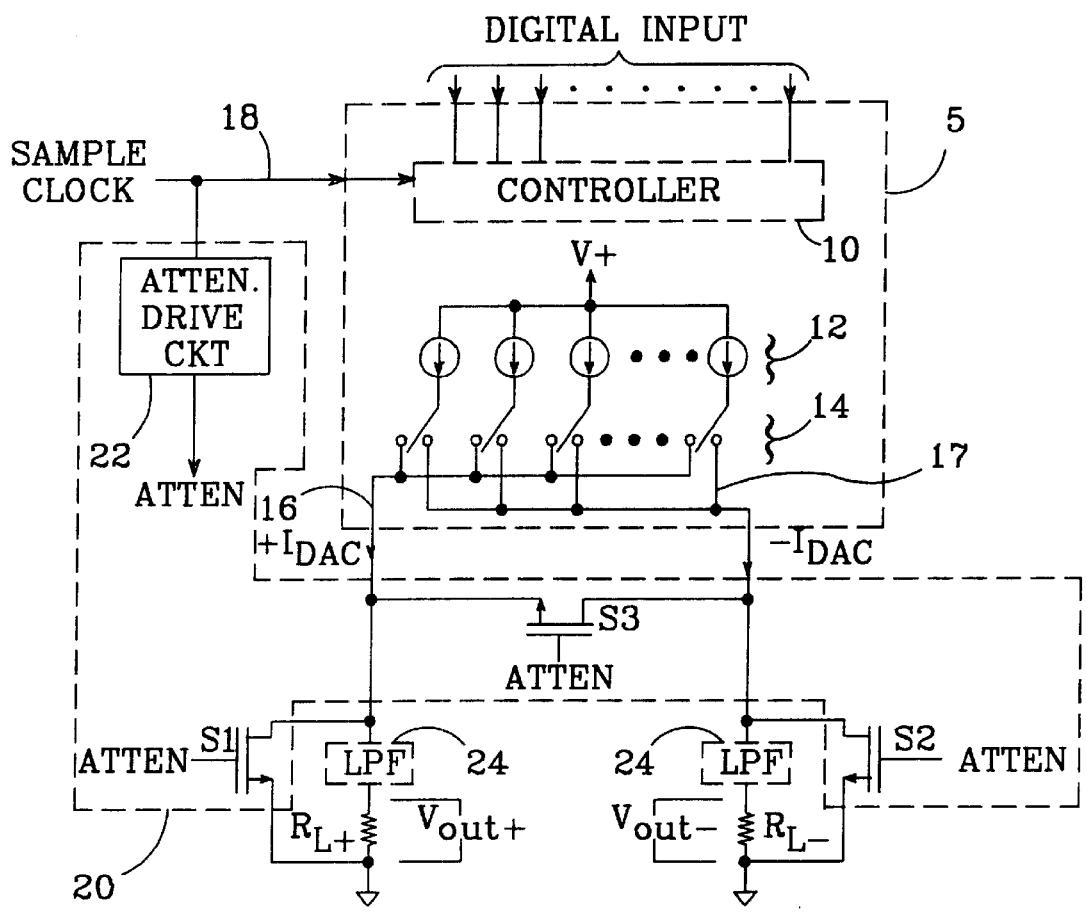
FIG. 1 is a schematic diagram illustrating the basic principles of the invention.
Figure 1:
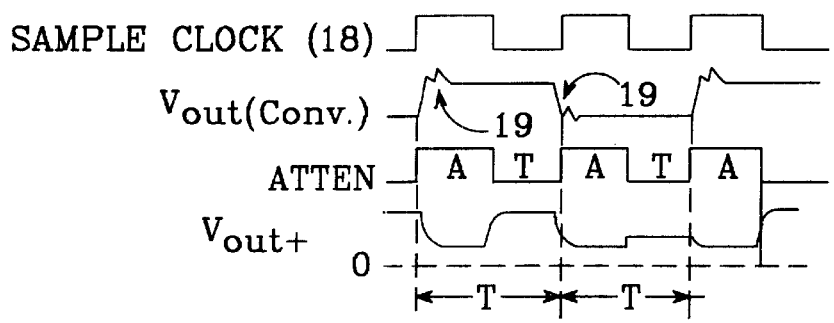

FIG. 1 illustrates the basic principles of the invention. A switched current source DAC includes a controller 10 which receives a digital input word representative of a desired differential output current. An array of current sources 12 have their outputs connected to respective two-position switches 14. Corresponding terminals on each switch are connected together to form a complementary pair of output lines 16 and 17. In response to the application of a digital input word, the controller places each of the switches into one of its two positions to provide the desired differential output current and on positive output line 16 (+$I_{DAC}$) and negative output line 17 (−$I_{DAC}$) The differential output current is connected to drive a load, depicted here as a differential load represented with a resistance $R_{L+}$ connected to positive output line 16, and a resistance $R_{L-}$ connected to negative output line 17. Output currents $I_{DAC+}$ and $I_{DAC-}$ drive loads $R_{L+}$ and $R_{L-}$, respectively, across which develop voltages $V_{out+}$ and $V_{out-}$.

A timing diagram for a conventional switched current source DAC as described above is shown in FIG. 1. A sample clock 18 having a period T is provided to controller 10. Once per cycle of the sample clock, controller 10 operates switches 14 as necessary to provide a differential output current on output lines 16 and 17 which corresponds with the digital input word applied to the controller. The resulting voltage $V_{out+}$ (conv.) across load resistance $R_{L+}$ is shown in the timing diagram. Conventional DAC outputs are full cycle, with the DAC output being valid for the whole clock period T. However, due to switching skew and parasitics, $V_{out+}$ (conv.) is corrupted by dynamic nonlinearities 19 at the start of each period T. These dynamic nonlinearities adversely affect the dynamic linearity of the DAC, significantly degrading its SFDR specification.

The switching skew/parasitic-caused dynamic nonlinearities 19 are substantially eliminated and the DAC's dynamic linearity dramatically improved by adding a track and attenuate (T/A) circuit 20 to the DAC. The T/A circuit includes three attenuate switches: single-ended switches S1 and S2 which short positive and negative output lines 16 and 17, respectively, to signal ground when closed, and a differential switch S3, which shorts output lines 16 and 17 together when closed. Each attenuate switch is controlled with an ATTEN signal, closing when ATTEN is high and opening when ATTEN is low. T/A circuit 20 also includes a drive circuit 22 which receives the sample clock 18 and generates the ATTEN signal.

The attenuate switches are preferably implemented with nMOS FETs, which make the T/A circuit unipolar, since only a single clock signal (ATTEN) is required to drive the switches. This avoids the problem of having to match rising and falling clock waveforms. Other switch types can also be employed, however, including pMOS and bipolar transistors.

The operation of the T/A circuit is illustrated in FIG. 1's timing diagram. The ATTEN signal is synchronized with sample clock 18: as current source output switches 14 are switched by controller 10, the ATTEN signal goes high ("A") and the attenuate switches close. With the attenuate switches closed, differential current outputs $+I_{DAC}$ and $-I_{DAC}$ are connected to ground through switches S1 and S2, respectively, and to each other via switch S3. The parallel connection of the low impedance switches with the output load lowers the effective output impedance, so that $V_{out+}$ is attenuated while the differential output current settles to a new value. Thus, with S1, S2 and S3 closed, the output current, and thus the dynamic nonlinearities 19, are largely prevented from being passed onto the load. Though the output signal and the dynamic nonlinearities are not reduced entirely to zero (the switches still have a finite impedance), it is greatly reduced, hence improving the DAC's SFDR. After the settling period, the circuit is set to "track" ("T"): S1, S2 and S3 are turned off and the differential output current is allowed to flow to the load. The overall effect is similar to "return-to-zero" (RZ) in that the output signal returns to a low voltage level when ATTEN is high and S1, S2 and S3 are turned on. However, the T/A circuit does cause the output signal power to be halved (assuming ATTEN has a 50/50 duty cycle).

When the T/A circuit is set to track, the output voltages $V_{out+}$ and $V_{out-}$ build up at a finite rate as capacitances associated with the load are charged. When the T/A circuit is set to attenuate, the same capacitances discharge, such that the integral of the voltage pulse is the desired analog value.

Because current to the load is interrupted for a portion of each clock cycle, some applications—i.e., those that would suffer from the introduction of clock frequency spurs into the output spectrum—may require a low pass filter or filters 24 to be inserted between positive and negative output lines 16 and 17 and the load to recover a properly shaped analog signal. The T/A circuit's only effect on the baseband, however, is to reduce the signal magnitude by 50% (assuming a 50/50 duty cycle for ATTEN). However, many applications either inherently filter the output currents, or require no filtering, such that discrete low pass filters are not necessary.

The ATTEN signal is depicted as having a 50/50 duty cycle in FIG. 1, which is a convenient value for most two-phase clocked DACs. A 50/50 duty cycle is not required however; in fact, the ideal T/A circuit would attenuate the output current only long enough during each clock cycle to mask out the dynamic nonlinearities that occur when the current sources switch, thus maximizing the output signal power.

Figure 2:
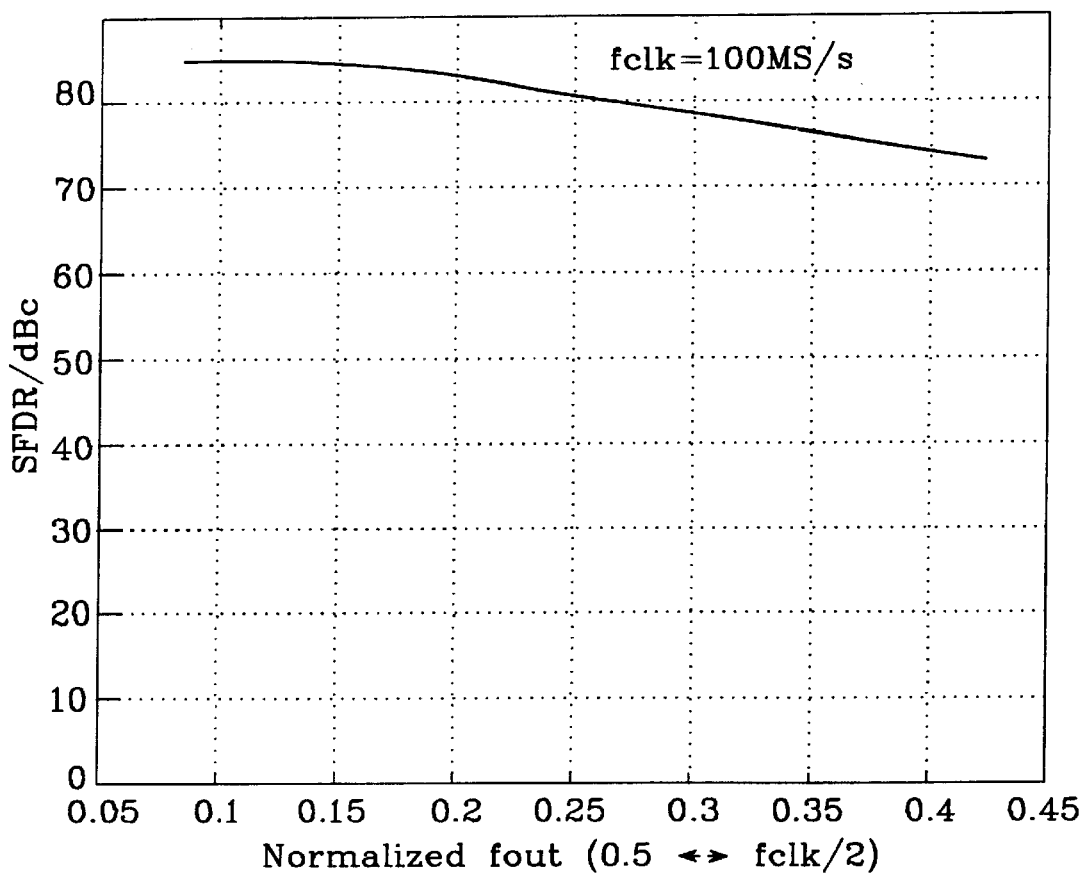
FIG. 2 is a plot of SFDR/dBc versus input signal frequency for a DAC with a T/A circuit per the present invention.

The dynamic linearity performance achievable with a typical DAC employing the present T/A circuit is illustrated in the graph of FIG. 2, which plots SFDR/dBc against input signal frequency (expressed as a fraction of the sample clock frequency fclk), for a sample rate of 100 MS/s. In contrast, a conventional switched current source DAC (which does not include the present invention) operated at a sample rate of 100 MS/s provides SFDR/dBc values that are 10–15 dB lower than those shown over a comparable range of input signal frequencies.

Figure 3:
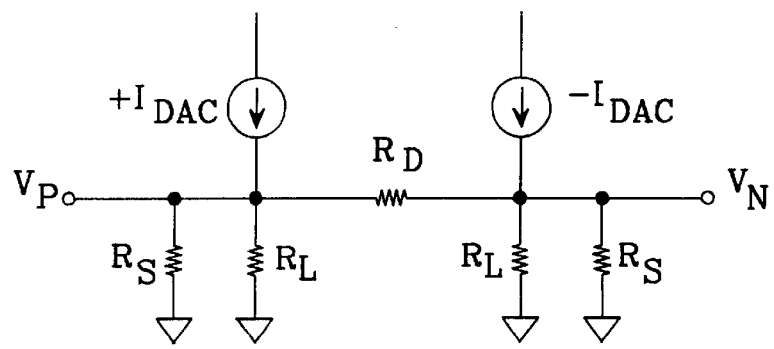
FIG. 3 is a schematic diagram which models the T/A circuit when in its attenuate mode.

By properly sizing the attenuate switches, the DAC's dynamic linearity performance can be maximized. For maximum dynamic linearity, the attenuation provided by the T/A circuit should be as large as possible. The attenuation provided can be quantified in terms of an "attenuation factor" (AF), which is defined as the resistance presented to the differential output current during the attenuate phase divided by the load resistance, with a lower AF providing greater attenuation. When all three attenuate switches are closed, the T/A circuit can be modeled as shown in FIG. 3, in which the resistance of each of single-ended switches S1 and S2 is $R_S$, the resistance of differential switch S3 is $R_D$, and the resistance of each of load resistances $R_{L+}$ and $R_{L-}$ is $R_L$. The voltages developed across the load resistances by $+I_{DAC}$ and $-I_{DAC}$ are $V_P$ and $V_N$, respectively, and the differential output voltage $V_{diff}$ (=$V_P$-$V_N$) for this configuration is given by:

$$V_{diff}=(+I_{DAC}-I_{DAC})[(R_P R_D)/(R_D+2R_P)]$$

and the attenuation factor AF is given by:

$$AF_{3\text{-}switch}=(R_P R_D)/[R_L(R_D+2R_P)],$$

where $R_P=R_L \| R_S$.

A similar analysis of a T/A circuit that includes only differential switch S3 provides the following equation for AF:

$$AF_{1\text{-}switch}=R_D/(R_D+2R_L).$$

For the same total switch size, i.e., with the size of switch S3 in the one-switch configuration being equal to the combined sizes of S1, S2 and S3 combined in the three-switch configuration, it can be shown that the AF is slightly lower for the one-switch configuration. Based solely on this result, a one-switch configuration would seem to be preferred.

However, this analysis ignores the effect on the resistance of the differential switch S3 of adding single-ended switches S1 and S2. This addition results in the common-mode voltage $V_{CM}$ of the output nodes being reduced from:

$$V_{CM1\text{-}switch} \approx I_{FS}[R_L^2/(2R_L+R_D)]$$

in the single-switch scheme, to:

$$V_{CM3\text{-}switch} \approx I_{FS}[R_P^2/(2R_P+R_D)]$$

in the three-switch scheme, where $I_{FS}$ is the full-scale DAC output current. With switch resistance $R_S$ typically much less than load resistance $R_L$, $V_{CM3\text{-}switch}$ is less than $V_{CM1\text{-}switch}$, and close to zero during the attenuate phase. When attenuate switches S1 and S2 are fabricated with an n-well CMOS process, this reduction in common-mode voltage increases the gate drive ($V_{GS}-V_{TH}$) of the differential switch by about 0.5–1 volt (depending on the DAC output current), decreases $V_{TH}$ because of the lower-body effect, and hence reduces the resistance $R_D$ of S3 by a factor of approximately ⅔. That is, the differential switch resistance per unit device width in the three-switch scheme is approximately ⅔ of its value in the single-switch scheme. When this is factored into the analysis, the AF of the three-switch scheme is approximately the same as that of the single-switch scheme.

However, the three-switch scheme is seen to be superior to a one-switch scheme when other factors are considered; in particular, charge injection and the threshold voltage effect, which introduce nonlinearities into the differential output current. These nonlinearities are directly related to the operation of the attenuation switches, rather than to the switching of the DAC's current sources. It can be shown that, if a configuration using only the two single-ended switches (two-switch scheme) is compared with the one-switch scheme, the former has superior channel charge injection and switch resistance characteristics from the linearity viewpoint. In the two-switch scheme, the switches have their source nodes grounded. To a first order approximation, then, the channel charge and switch resistance remain constant, since $V_{GS}$ is a constant dependent only on the clock waveform voltage, and $V_{TH}$ is constant and signal independent because there is no signal on the source node. Therefore, the charge injection when the switches are turned off, as well as the charge uptake when they are turned on (significant in a current-limited DAC output) are both constant, and the switch resistance is also constant. In the single-switch case, however, there is a signal component on both the switch nodes. The channel charge is therefore signal-dependent, as is the threshold voltage due to the backgate effect, thus reducing the linearity of the output stage. When all of these factors are considered, it is clear that a three-switch implementation is superior to either a two-switch or one-switch configuration; as such, the invention requires a three-switch implementation as described herein.

Additional analysis has been performed to determine the optimum division of the total switch size among the three switches. Based on this analysis, it has been determined that making the differential switch S3 twice as large as either of single-ended switches S1 and S2 provides the best AF with the least charge injection and threshold voltage effects.

Figure 4:
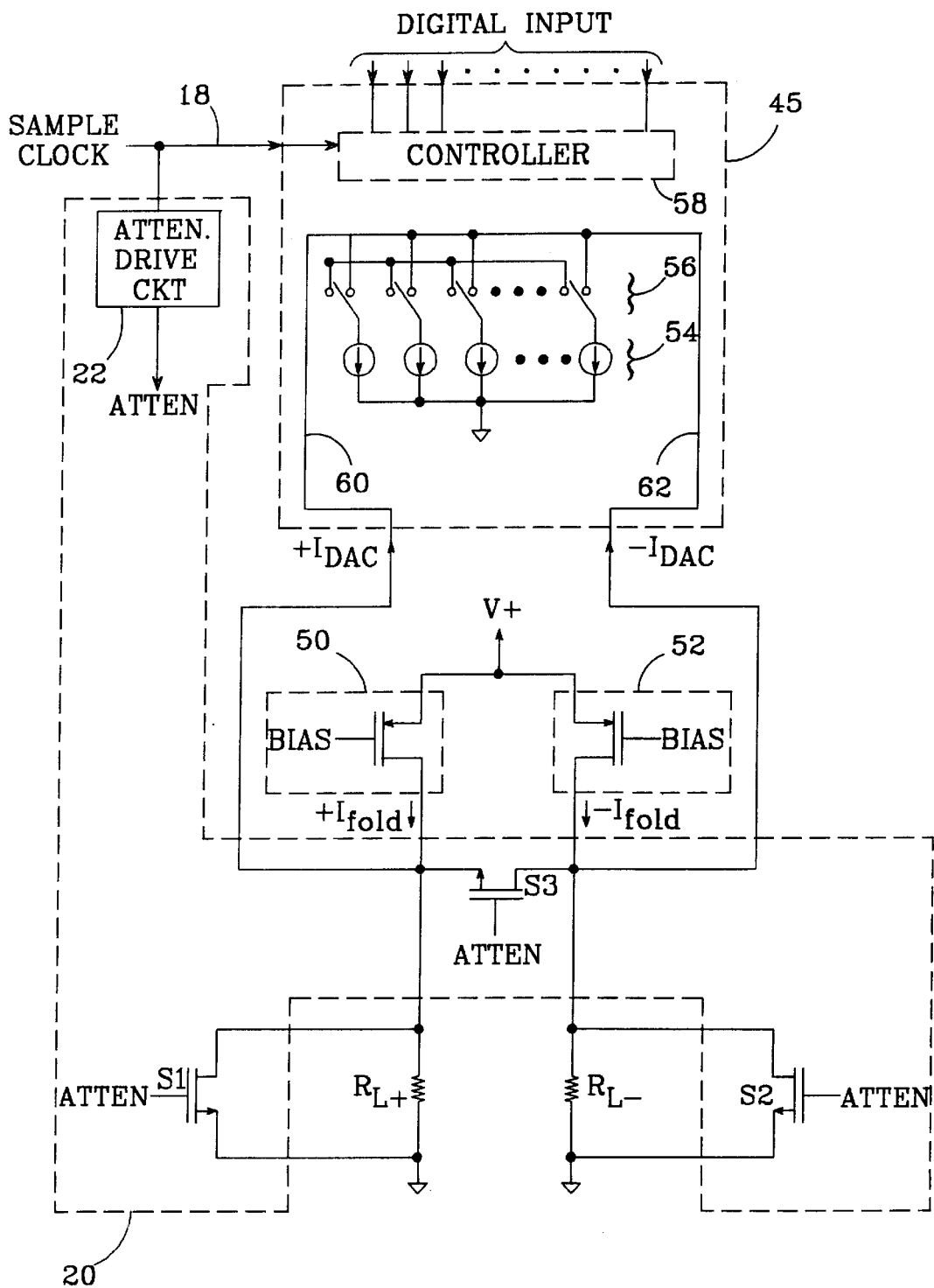
FIG. 4 is a schematic diagram of a DAC with a T/A circuit per the present invention which also includes a pair of folding current sources.

Another embodiment of a DAC employing a T/A circuit 20 per the present invention is shown in FIG. 4, in which a pair of folding current sources 50 and 52 are connected to the switched current sources' complementary output lines. As above, the DAC includes an array of current sources 54 connected to respective switches 56, with a controller 58 arranged to operate switches 56 in response to the application of a digital input word to provide a desired differential output current $(+I_{DAC}, -I_{DAC})$ on complementary output lines 60 and 62. As configured in FIG. 4, current sources 54 operate as current sinks. Folding current sources 50 and 52 convert sunk currents $+I_{DAC}$ and $-I_{DAC}$ to sourced currents; sources 50 and 52 are preferably implemented with a pair of pMOS transistors $Q_{f+}$ and $Q_{f-}$, which receive a fixed bias voltage BIAS at their respective gate inputs and have their respective sources connected to a positive supply voltage V+. The BIAS voltage is set so that folding current sources 50 and 52 conduct respective currents $+I_{fold}$ and $-I_{fold}$ which are greater than the currents being folded; i.e., $+I_{fold}$ is greater than $+I_{DAC}$ and $-I_{fold}$ is greater than $-I_{DAC}$. Note that, while folding current sources 50 and 52 are shown converting sunk currents to sourced currents, folding current sources can also be used to convert sourced currents (such as $+I_{DAC}$ and $+I_{DAC}$ in FIG. 1) to sunk currents, using, for example, nMOS FETs.

Figure 5:
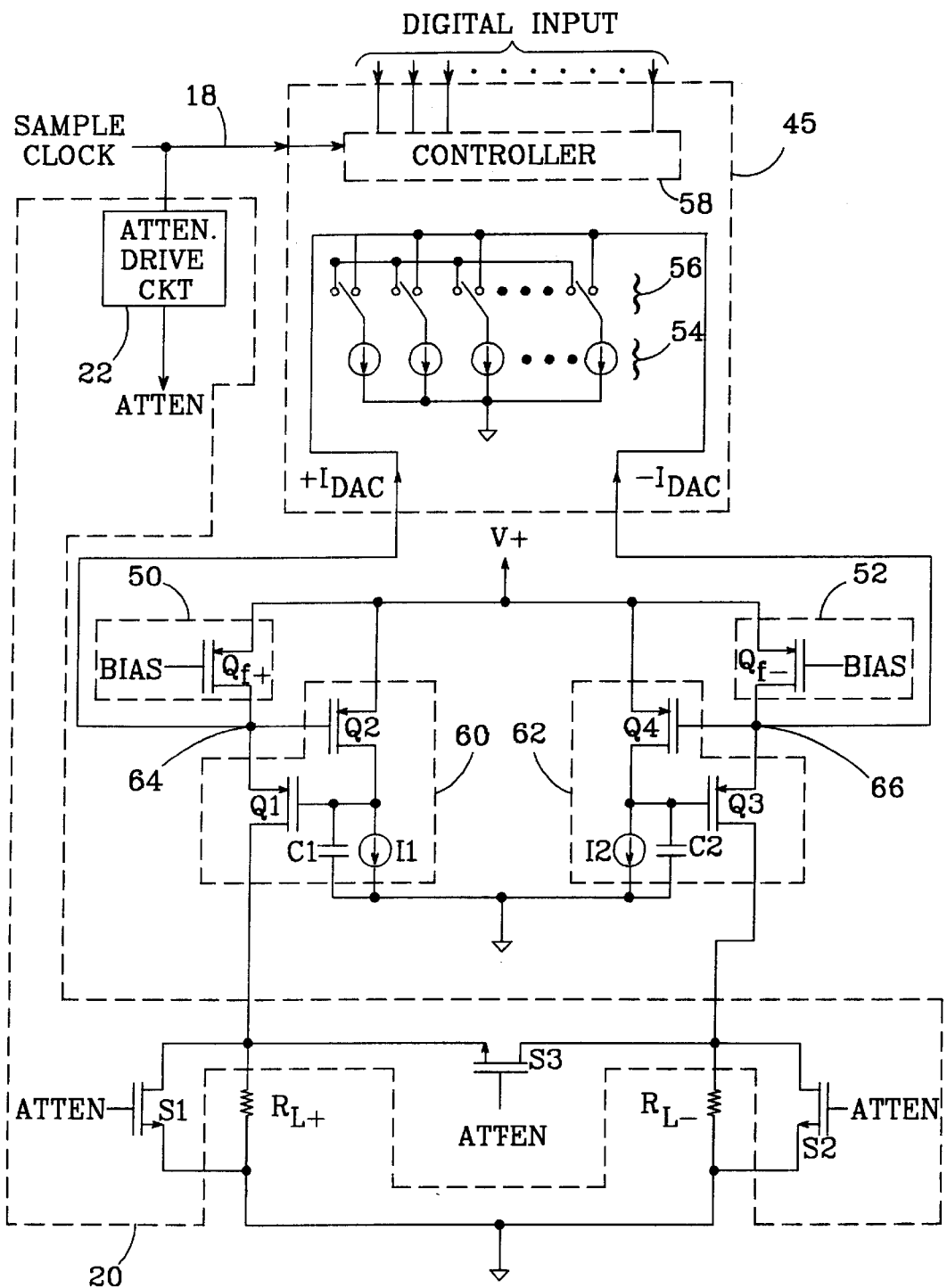
FIG. 5 is a schematic diagram of a preferred implementation of a DAC with a T/A circuit per the present invention.

A preferred embodiment of a switched current source DAC with a T/A circuit per the present invention is shown in FIG. 5. This implementation adds regulated cascode circuits 60 and 62 to the FIG. 4 embodiment, which are connected between the differential output currents $+I_{DAC}$ and $-I_{DAC}$ and T/A circuit 20. Cascode circuits 60 and 62 keep the drain terminals of folding current source transistors $Q_{f+}$ and $Q_{f-}$ and the differential output currents $+I_{DAC}$ and $-I_{DAC}$ at approximately constant potentials, which improves the DAC's static linearity. Cascode circuit 60 comprises a pair of pMOS FETs Q1 and Q2, with the source-drain circuit of Q1 connected between $+I_{DAC}$ and attenuate switch S1, and the source-drain circuit of Q2 connected between V+ and the gate of Q1; Q2's gate is connected to $+I_{DAC}$ at a junction 64. Cascode circuit 60 is biased with a bias current source I1 connected between the gate of Q1 and signal ground, and is compensated with a capacitor C1 connected in parallel with I1. When so arranged, the cascode circuit's feedback loop sets the voltage at junction 64 to the $V_{gs}$ voltage of Q2, keeping the drain of $Q_{f+}$ and differential output current $+I_{DAC}$ approximately constant. By so doing, the DAC's static linearity is significantly improved.

Similarly, cascode circuit 62 comprises a pair of pMOS FETs Q3 and Q4, with the source-drain circuit of Q3 connected between $-I_{DAC}$ and attenuate switch S2, and the source-drain circuit of Q4 connected between V+ and the gate of Q3; Q3's gate is connected to $-I_{DAC}$ at a junction 66. Cascode circuit 62 is biased with a bias current source I2 connected between the gate of Q3 and signal ground, and is compensated with a capacitor C2 connected in parallel with I2. When so arranged, the cascode circuit's feedback loop sets the voltage at junction 66 to the $V_{gs}$ voltage of Q4, keeping the drain of $Q_{f-}$ and differential output current $-I_{DAC}$ approximately constant.

The unity gain bandwidth of the cascode circuits is preferably kept in excess of the minimum required for them to settle within one clock cycle for all output current values by forcing a fixed dc current component through each side of the differential circuit. The dc component is preferably obtained by excess biasing of folding current sources 50 and 52, which results in maintaining a minimum acceptable bandwidth for settling the voltages at junctions 64 and 66, even at the zero DAC current position. The impedance looking into the regulated cascode circuits should be made sufficiently large so as to ensure that DAC current sources 54 are adequately isolated from the switching at midcycle and are not disturbed significantly from their settled position at that point.

Note that the folding current sources and regulated cascode circuits shown are merely exemplary; many other circuit configurations could be employed between the differential current outputs and the T/A circuit to provide the same functions. For example, the T/A circuit may be re-configured to use FET transistors having polarities opposite to those shown in FIGS. 4 and 5, or may be implemented with bipolar transistors.

While particular embodiments of the invention have been shown and described, numerous variations and alternate embodiments will occur to those skilled in the art. Accordingly, it is intended that the invention be limited only in terms of the appended claims.

We claim:
1. A switched current source digital-to-analog converter (DAC), comprising:
   an array of current sources which produce respective output currents,
   an array of switches which are connected to switch respective ones of said current source outputs to one of a complementary pair of output lines in response to respective control signals to provide a differential output current on said complementary pair of output lines, a controller which receives a digital input word representing a desired differential output current and a sample clock at respective inputs and which provides said control signals to said switches to produce said desired differential output current, said controller arranged to operate said switches once per cycle of said sample clock, said differential output current settling within a predetermined time period after said switches have been operated, and a track and attenuate (T/A) circuit, said T/A circuit comprising:
a first attenuate switch which connects one of said complementary output lines to a signal ground when closed in response to an attenuate signal,
a second attenuate switch which connects the other of said complementary output lines to signal ground when closed in response to said attenuate signal,
a third attenuate switch which connects said complementary output lines together when closed in response to said attenuate signal, and
an attenuate switch drive circuit arranged to produce said attenuate signal such that each of said attenuate switches is closed during said predetermined settling time to attenuate said differential output current while said differential output current is settling.

2. The DAC of claim 1, wherein said complementary pair of output lines comprises a positive output line and a negative output line, each of said switches connecting its current source output to said positive output line or said negative output line in response to a respective one of said control signals.

3. The DAC of claim 1, wherein said first, second and third attenuate switches are transistors.

4. The DAC of claim 3, wherein said transistors are field-effect transistors (FETs), said FETs receiving said attenuate signal at their respective gate inputs.

5. The DAC of claim 4, wherein the FET comprising said third attenuate switch is twice as large as the FETs comprising either of said first and second attenuate switches.

6. The DAC of claim 4, wherein said FETs are n-well FETs.

7. The DAC of claim 3, wherein said transistors are bipolar junction transistors (BJTs), said BJTs receiving said attenuate signal at their respective base inputs.

8. The DAC of claim 1, wherein said attenuate switch drive circuit receives said sample clock and is arranged to close said attenuate switches and attenuate said differential output current for half of each sample clock cycle and to open said attenuate switches and thereby stop attenuating said differential output current for the remaining half of each sample clock cycle.

9. The DAC of claim 1, wherein said complementary pair of output lines comprise a positive output line and a negative output line and said DAC is arranged such that said differential output current is sourced by said current sources, further comprising first and second folding current sources connected to said positive and negative output lines, respectively, to sink the differential output current sourced by said current sources.

10. The DAC of claim 1, wherein said complementary pair of output lines comprise a positive output line and a negative output line and said DAC is arranged such that said differential output current is sunk by said current sources, further comprising first and second folding current sources connected to said positive and negative output lines, respectively, to source the differential output current sunk by said current sources.

11. The DAC of claim 10, wherein said first and second folding current sources comprise first and second transistors having respective current circuits connected between a positive supply voltage and said positive and negative output lines, respectively, and which receive respective bias voltages at their control inputs such that said first and second transistors conduct said differential output current sunk by said current sources.

12. The DAC of claim 11, further comprising first and second regulated cascode circuits,
said first regulated cascode circuit comprising:
a third transistor having its current circuit connected between said positive output line and said first attenuate switch,
a fourth transistor having its control input connected to said positive output line and its current circuit connected between said positive supply voltage and the control input of said third transistor,
a first bias current source connected between the control input of said third transistor and said signal ground, said third and fourth transistors and said first bias current source forming a first feedback loop arranged to make the potential on said positive output line substantially constant, and
a first capacitor connected between the control input of said third transistor and said signal ground to compensate said first feedback loop,
said second regulated cascode circuit comprising:
a fifth transistor having its current circuit connected between said negative output line and said second attenuate switch,
a sixth transistor having its control input connected to said negative output line and its current circuit connected between said positive supply voltage and the control input of said fifth transistor,
a second bias current source connected between the control input of said fifth transistor and said signal ground, said fifth and sixth transistors and said second bias current source forming a second feedback loop arranged to make the potential on said negative output line substantially constant, and
a second capacitor connected between the control input of said fifth transistor and said signal ground to compensate said second feedback loop.

13. The DAC of claim 1, wherein said complementary output lines are connected to drive respective loads, further comprising a low pass filter connected between one of said complementary output lines and said output line's respective load to reduce the magnitude of sample clock-frequency spurs introduced into the DAC's output spectrum by said T/A circuit.

14. A switched current source digital-to-analog converter (DAC), comprising:
an array of current sources which sink respective output currents,
an array of switches which are connected to switch respective ones of said current source outputs to one of a complementary pair of output lines in response to respective control signals to provide a differential output current on said complementary pair of output lines,
a controller which receives a digital input word representing a desired differential output current and a sample clock at respective inputs and which provides said control signals to said switches to produce said desired differential output current, said controller arranged to operate said switches once per cycle of said sample clock, said differential output current settling within a predetermined time period after said switches have been operated, first and second folding current sources connected to said positive and negative output lines, respectively, said folding current sources arranged to source the differential output current sunk by said current sources, first and second regulated cascode circuits, said first regulated cascode circuit comprising:
 a first transistor having its current circuit connected between said positive output line and a positive output terminal,
 a second transistor having its control input connected to said positive output line and its current circuit connected between a positive supply voltage and the control input of said first transistor,
 a first bias current source connected between the control input of said first transistor and a signal ground, said first and second transistors and said first bias current source forming a first feedback loop arranged to make the potential on said positive output line substantially constant, and
 a first capacitor connected between the control input of said first transistor and said signal ground to compensate said first feedback loop, said second regulated cascode circuit comprising:
 a third transistor having its current circuit connected between said negative output line and a negative output terminal,
 a fourth transistor having its control input connected to said negative output line and its current circuit connected between said positive supply voltage and the control input of said third transistor,
 a second bias current source connected between the control input of said third transistor and said signal ground, said third and fourth transistors and said second bias current source forming a second feedback loop arranged to make the potential on said negative output line substantially constant, and
 a second capacitor connected between the control input of said third transistor and said signal ground to compensate said second feedback loop, and a track and attenuate (T/A) circuit, said T/A circuit comprising:
 a first attenuate switch which connects said positive output terminal to said signal ground when closed in response to an attenuate signal,
 a second attenuate switch which connects said negative output terminal to said signal ground when closed in response to said attenuate signal,
 a third attenuate switch which connects said positive and negative output terminals together when closed in response to said attenuate signal, and
 an attenuate switch drive circuit arranged to produce said attenuate signal such that each of said attenuate switches is closed during said predetermined settling time to attenuate the currents at said positive and negative output terminals while said differential output current is settling.

15. The DAC of claim 14, wherein said first and second folding current sources comprise fifth and sixth transistors having respective current circuits connected between said positive supply voltage and said positive and negative output lines, respectively, and which receive respective bias voltages at their control inputs such that said fifth and sixth transistors conduct said differential output current sunk by said current sources.

16. The DAC of claim 15, wherein said regulated cascode circuits are arranged such that their respective unity gain bandwidths are in excess of the minimum required for them to settle within one clock cycle for all output current values.

17. The DAC of claim 14, wherein said first, second and third attenuate switches are field-effect transistors (FETs), said FETs receiving said attenuate signal at their respective gate inputs.

18. The DAC of claim 17, wherein the FET comprising said third attenuate switch is twice as large as the FETs comprising either of said first and second attenuate switches.

19. A method of improving the dynamic linearity of a switched current source digital-to-analog converter (DAC), comprising the steps of:
 generating a differential output current on positive and negative output lines with an array of switched current sources in response to a first digital input word, said array of switched current sources forming a DAC,
 attenuating the output current on said positive output line while said output current is transitioning to a new value in response to a change in said digital input word,
 attenuating the output current on said negative output line while said output current is transitioning to said new value in response to said change in said digital input word, and
 connecting said positive and negative output lines together to attenuate said differential output current while said output current is transitioning to said new value in response to said change in said digital input word.

20. The method of claim 19, wherein said DAC receives a sample clock, said output current transitions to a new value in response to changes in said digital input word once per cycle of said sample clock, and said attenuating occurs during a portion of each sample clock cycle.

21. The method of claim 20, further comprising the step of filtering said differential output current to reduce the magnitude of sample clock-frequency spurs introduced into the DAC's output spectrum by said attenuating.

22. The method of claim 20, wherein said positive and negative output lines are attenuated with respective single-ended switches which connect said output lines to a signal ground in response to an attenuate signal, and said positive and negative output lines are connected together with a differential switch in response to said attenuate signal.

23. The method of claim 22, further comprising the step of generating said attenuate signal such that said attenuating occurs during the portion of each sample clock cycle when said output current transitions to a new value in response to changes in said digital input word.

* * * * *